(12) United States Patent
Baumgartl et al.

(10) Patent No.: US 8,803,525 B2
(45) Date of Patent: Aug. 12, 2014

(54) LOCAL COIL FOR A MAGNETIC RESONANCE DEVICE

(75) Inventors: Rudi Baumgartl, Erlangen (DE); Stephan Biber, Erlangen (DE); Martin Hemmerlein, Bamberg (DE)

(73) Assignee: Siemens Aktiengesellschaft, München (DE)

( * ) Notice: Subject to any disclaimer, the term of this patent is extended or adjusted under 35 U.S.C. 154(b) by 428 days.

(21) Appl. No.: 13/044,206

(22) Filed: Mar. 9, 2011

(65) Prior Publication Data

US 2011/0221441 A1   Sep. 15, 2011

(30) Foreign Application Priority Data

Mar. 10, 2010   (DE) .......................... 10 2010 010 820

(51) Int. Cl.
*G01R 33/44* (2006.01)
*G01R 33/36* (2006.01)
*G01R 33/3415* (2006.01)

(52) U.S. Cl.
CPC ........ *G01R 33/3664* (2013.01); *G01R 33/3415* (2013.01)
USPC .......................................... 324/322; 324/318

(58) Field of Classification Search
CPC .................... G01R 33/3664; G01R 33/3415
USPC .................................. 324/322, 318; 600/410
See application file for complete search history.

(56) References Cited

U.S. PATENT DOCUMENTS

| | | | |
|---|---|---|---|
| 4,284,950 A | 8/1981 | Burl et al. | |
| 5,548,218 A | 8/1996 | Lu | |
| 5,551,430 A * | 9/1996 | Blakeley et al. | 600/410 |
| 6,362,622 B1 * | 3/2002 | Stauber et al. | 324/318 |
| 6,545,475 B2 * | 4/2003 | Kroeckel et al. | 324/318 |
| 2007/0170917 A1 * | 7/2007 | Thompson et al. | 324/307 |
| 2009/0149737 A1 * | 6/2009 | Hansen et al. | 600/421 |
| 2011/0169489 A1 * | 7/2011 | Leussler | 324/307 |

FOREIGN PATENT DOCUMENTS

| | | |
|---|---|---|
| CN | 101630299 A | 1/2010 |
| DE | 10 2007 011 145 A1 | 4/2008 |
| GB | 2 277 160 A | 10/1994 |

OTHER PUBLICATIONS

German Office Action dated Nov. 17, 2010 for corresponding German Patent Application No. DE 10 2010 010 820.0-54 with English translation.
Chinese Office Action dated Mar. 4, 2013 for corresponding Chinese Patent Application No. 201110057036.X with English translation.

(Continued)

*Primary Examiner* — Melissa Koval
*Assistant Examiner* — Rishi Patel
(74) *Attorney, Agent, or Firm* — Lempia Summerfield Katz LLC

(57) ABSTRACT

A local coil for a magnetic resonance device includes a connector apparatus for establishing a connection to a plug-in station on a patient couch and at least one storage facility. The storage facility may be used to read out by way of the connection and may store at least one non-modifiable data item describing a property of the local coil. The storage facility may include at least one detection facility for acquiring measurement values describing the state of the local coil and at least one evaluation facility configured to modify the readout address of the storage facility as a function of the measurement values.

20 Claims, 2 Drawing Sheets

(56) References Cited

OTHER PUBLICATIONS

Block T. K., et al., "Undersampled Radial Mri with Multiple Coils. Iterative Image Reconstruction Using a Total Variation Constraint," Magnetic Resonance in Medicine 57, pp. 1086-1098, (2007).

Vaughan J. T., et al., "Efficient High-Frequency Body Coil for High-Field MRI," Magnetic Resonance in Medicine 52, pp. 851-859, (2004).

* cited by examiner

LOCAL COIL FOR A MAGNETIC RESONANCE DEVICE

This application claims the benefit of DE 10 2010 010 820.0, filed Mar. 10, 2010.

BACKGROUND

The present embodiments relate to a local coil for a magnetic resonance system and a method for indicating a change in the state of the local coil.

Local coils are used increasingly frequently in modern magnetic resonance facilities. Signal quality may be improved when the coil conductors receiving the magnetic resonance signals are positioned closer to the object to be recorded. Such local coils are known as transmit coils, receive coils, and also combined transmit and receive coils.

To read or activate local coils, it is usual, in order to avoid long cable runs, to connect the local coils by a connector apparatus, such as a plug, to a plug-in station on a patient couch of the magnetic resonance facility. A patient couch may have, for example, eight plug-in stations, which are disposed according to frequently used positions for local coils.

For correct activation, energization and/or data evaluation, the system knows which type of local coil (for example head coil, body coil, back coil, etc.) has been connected to a plug-in station. Two methods are used for providing information about the connected local coils.

First, it is possible to identify a local coil connected to a magnetic resonance facility using an analog method. Here resistors are used, the resistance value of which can be read out so that the magnetic resonance facility identifies the coil type with the aid of corresponding software. Two resistors may be used for example. From the two resistance values, it is possible after analog-to-digital conversion to generate a 1-byte code. The 1-byte code may be used to identify the coil type. However coil-specific data, such as serial number, product status, manufacturer and the like, are not disclosed with such systems.

When using such analog coil code resistors, it is possible also to inform the magnetic resonance facility of a state change of the local coil. This can be done by embodying the resistance values in a switchable manner so that a change in the resistance value therefore also results in a change in the 1-byte code. The code is used by the magnetic resonance facility as a pointer to a certain file (information). The file describes how the code should be interpreted ("which coil is connected?"). This change in the resistance value informs the magnetic resonance facility of a state change of the coil and the content of the change. Possible state changes are for example (excessive) temperature of critical components, orientation of the local coil, switch positions at the local coil, and/or the combining of the local coil with other parts (e.g. head coil upper part and head coil lower part).

However, this procedure with analog resistors also has disadvantages. The connection of the local coil to the plug-in station and also a change in the detected resistance values are identified by a discriminator circuit. Such a discriminator circuit is susceptible to the unwanted injection of gradient or high-frequency signals, as occur regularly in a magnetic resonance facility. This can lead to an incorrect response on the part of the magnetic resonance facility, for example deactivation during a sequence. A change in the resistance values during the sequence run-through results in the sequence being terminated.

Also when resistance values are used, it is not possible to implement a specific trigger signal or interrupt signal, upon which the local coil informs the magnetic resonance facility about a state change. For, ultimately, detection of the resistance change represents an association with interrupt generation (state change, in other words termination of the sequence) and information about the type of state change, both being implemented in a single function. This is disadvantageous, because additional resistance codes are used and these are not available in very large quantities with analog resistors. Every change of state is necessarily always associated with the generation of an interrupt signal or trigger signal. This makes the interface inflexible, as only state changes that are to be allowed to result in a sequence termination can be mapped.

Finally, as mentioned above, it is not possible via the implementation of an analog interface with resistance values to provide coil-specific data. Such data is useful for example in asset management or when tracking individual local coils and when specifically matching a magnetic resonance facility to specific local coils. An implementation with analog resistors would be conceivable but very complex and extremely ineffective.

The second known variant for identifying a local coil connected to a magnetic resonance facility is a digital interface, with which a digital storage module, for example an EEPROM (Electrically Erasable Programmable Read Only Memory), is used. Further information in addition to the information about the coil type (coil code) can be stored in such storage facilities. The disadvantage of such an implementation is that once the data is stored on the storage facility, the information is fixed. The information can no longer be changed. The use of storage facilities, the content of which may be changed by the local coil itself, would be expensive and ineffective. When using a digital interface, (e.g., a readable storage facility), state changes of the coil may not be disclosed to the system.

SUMMARY AND DESCRIPTION

An interface may have four technical functionalities: (1) the local coil provides the magnetic resonance device with information about the coil type; (2) the coil is operable to disclose state changes to the magnetic resonance device; (3) the coil discloses to the magnetic resonance device what has changed (e.g., content of the state change such as excessive temperature and the like); and (4) the local coil is operable to disclose coil-specific data to the magnetic resonance device (e.g., for asset management).

The present embodiments may obviate one or more of the drawbacks or limitations in the related art. For example, the interface of a local coil with a magnetic resonance device may be configured such that the advantages of the analog and digital approaches may be utilized together in a simple to implement and cost-effective manner.

In one embodiment, a local coil includes at least one detection device for acquiring measurement values describing a state of the local coil, and at least one evaluation device configured to modify a readout address of the storage device as a function of the measurement values.

The present embodiments provide for using storage devices, in which the data stored therein may no longer be changed but which feature a modifiable readout address. The storage devices may be read out by way of the modifiable readout address, for example, in a bus system. Examples of the storage devices are electrically erasable programmable read-only memory (EEPROM) or flash memories. The bus system used may be an Inter Integrated Circuit (I2C) bus, for example. Storage devices that are read out by way of a bus have the option of a modifiable address in order to be able to implement the use of a number of storage devices on a single bus. The storage devices on the bus may be selectively addressed, for example, by way of corresponding addresses. The present embodiments use storage devices, the readout address of which is modifiable, and use the readout address in order to map state changes of the local coil by the modification of the readout address. The stored content of the storage device is not only interpreted but the address of the storage device (e.g., a storage module) is included in the interpretation and the state of the local coil is coded into the interpretation.

The local coil has a local coil interface design, in which properties of the coil (e.g., coil type data and coil-specific data) are written into a storage facility (e.g., an EEPROM), and the content of state changes may be disclosed to the magnetic resonance device by modifying the address of the storage module. The properties may be written into the storage facility permanently. The content of state changes may be disclosed to the magnetic resonance device in a very simple manner with respect to circuits, without the content of the storage device being modified. The address of the storage device is used as a property that may be modified easily with respect to circuits such that, when using digital storage facilities, the content of the modification may be communicated to the magnetic resonance device without modifying the content of the storage device.

In one embodiment, a method for disclosing state changes of a local coil to the magnetic resonance device, without modifying the content of the storage module (e.g., the storage device including the coil type and coil-specific data), the method being simple with respect to circuits, is specified. Coil-specific data may be disclosed to the magnetic resonance device or another system using digital storage on a commercially available storage medium (e.g., a digital interface), and the digital interface may be used to transmit information about the content of state changes.

All the data stored in the storage device may not be read out. When connecting a coil to a plug-in station or in the event of a state change, a data item may be read out (e.g., the coil type (also referred to as coil code)). The coil code may code, for example, whether the coil is a head coil, a whole body coil, a back coil or another coil type. Regardless of whether only the coil type data item is read out in the event of a state change or when connecting the local coil, the storage device may contain any number of further data items relating to properties of the local coil (e.g., the serial number, manufacturer and the like), which may be used in asset management or be requested in response to specific queries from the magnetic resonance device. Any number of options may be used to determine which data stored in the storage device should actually be read out when the coil is connected or in the event of a state change, depending on the functionalities required. For example, a unique serial number of the local coil may also be read out if the utilization of the local coil with the magnetic resonance device is to be tracked or the like.

Further details will be examined below with respect to magnetic resonance device and the method of the present embodiments, with regard to reading out the data and the readout address, deriving information from the data and the readout address and specifically utilizing the data.

According to the present embodiments, the state change is ascertained by way of a detection device, which may record one or more measurement values describing the state of the local coil (e.g., measuring the temperature and/or orientation of the local coil). The evaluation device, which may be a simple evaluation circuit, evaluates the data, for example, based on criteria. Whether the temperature exceeds a threshold value or is within a certain interval may be checked in order to ultimately detect a state change. If the evaluation device ascertains such a state change, the evaluation device modifies the readout address of the storage device, so that the state change may be ascertained when the storage device is read out by way of the connection.

With magnetic resonance devices, steps may be taken (e.g., during magnetic resonance data recording) to avoid running electrical and/or electronic processes, since electrical and/or electronic processes cause interference with the data recording. Accordingly, there are drawbacks with continuous or intermittent reading of the storage device.

In one embodiment, the evaluation facility may be configured to emit a trigger signal to an external control device of the magnetic resonance device when the readout address of the storage device is modified. The evaluation device, whenever a state change occurs and the readout address of the storage facility is modified, transmits the trigger signal (e.g., an interrupt signal) to a control device of the magnetic resonance device, which is responsible for reading out the storage device. The trigger signal may be transmitted by way of a line provided specifically for transmitting the trigger signal. When the control device receives the trigger signal, the control device is activated if the control device was previously inactive. In each instance, the control device reads out the storage devices and determines the address at which the storage device may be read out. A separate trigger signal or interrupt signal may also be provided, the separate trigger signal disclosing the state change to the magnetic resonance device.

The readout address of the storage device may be adjusted by way of a number of address bits that may be modified by way of corresponding connectors of the storage device (e.g., by way of two or three address bits). Commercially available storage devices (e.g., EEPROMs) may have two to three address bits, which may be wired externally to the module as a specific connection. Where there are two address bits, four different addresses may be set, and where there are three address bits, eight different addresses may be set. As a basic setting, all the address bits may be set to the value "0", indicating the normal state. When a state change occurs, the evaluation device may act on address bits, optionally as a function of the type of state change, to map the state change using a modification of the readout address.

In one embodiment, only some of the address bits are modified by the evaluation device. Part of the address remains fixed, which may be advantageous, if a number of storage devices may be provided at one plug-in station (e.g., on one bus). Head coils may include a head coil upper part and a head coil lower part. The head coil upper part is not connected directly to the system but is plugged into the head coil lower part. The non-modifiable address bit(s) may be set differently for the storage device of the upper part from the setting for the lower part, so that the head coil upper part and the head coil lower part are at distinguishable addresses, even if a state change is indicated. When the head coil upper part is plugged in, an interrupt signal results, which the magnetic resonance device (e.g., the control device) notes so that the two storage devices (e.g., for the head coil upper part and the head coil lower part) at different readout addresses may be identified and read out at one plug-in station. Readout addresses may have a fixed component, and a component that may be modified by the evaluation device may also be used in other instances, in which more than one storage device is to be connected to a plug-in station. For example, in the case of a 3-bit readout address, a first bit may be fixed so that four different states of the local coil may be mapped by way of the two other bits.

The detection device may be a temperature detector and/or an orientation detector (e.g., including at least one Hall sensor). However, other detectors may also be used to detect states of the local coil and bring about modification of the readout address in the event of state changes (e.g., with respect to the detection of switch positions).

A temperature detector of the local coil (e.g., a local coil configured to transmit) may be evaluated by a detector circuit (e.g., the evaluation device). When a predetermined permitted temperature is exceeded, the readout address of the storage device is modified to map a current state (e.g., excessive temperature) or a temperature range of the local coil. As described above, the evaluation device may send a trigger signal to the magnetic resonance device at the same time, to bring about a sequence termination and/or new reading of the storage device (e.g., the address). Excessive temperatures or certain temperature ranges may be disclosed to the magnetic resonance device by modifying the readout address.

Another example is the orientation of local coils. Anterior abdomen coils (body matrix), for example, may be present in different orientations. In order to be able to ascertain the corresponding state and a state change, one or more Hall sensors may be provided. A detector circuit acting as the evaluation device brings about a switching of the readout address at the storage device in the event of an orientation change (e.g., from a specified angle range to another). For example, four orientations (e.g., 0°, 90°, 180°, 270°) of the local coil in relation to the basic magnetic field of the magnetic resonance device may be disclosed to the magnetic resonance device. The same applies for other types of local coil, for which whether the other types of local coil are disposed head-first or feet-first on the patient couch may be detected (e.g., a peripheral angiography array).

The local coil of the present embodiments may be implemented as a plurality of different local coils (e.g., as a head coil or a partial head coil, a body coil or a back coil).

In one embodiment, a resonance device includes a control device configured to read out a storage device of the local coil by way of a data connection established by a connector apparatus plugged into a plug-in station. The control device is configured to determine information describing the readout address of the storage device and the data item. One or more local coils of the present embodiments may also be assigned in a targeted manner to the magnet facility of the present embodiments, thereby forming part of the magnetic resonance device of the present embodiments.

The magnetic resonance device adds a further control device to the arrangement in the local coil, the control device, after reading out the storage device (e.g., after determining the readout address and the data item) generating information therefrom. The information may be used for further processing within the magnetic resonance device. In contrast to systems of the prior art, the information contains not only the data item read out of the storage device but also the address at which the storage facility may be read out. As described above, certain states of the local coil may be mapped out after state changes by way of the readout address.

Every data item stored in the storage facility may not be read out for every purpose. As described above, one specified data item (e.g., the coil type (coil code)) may be read out when the local coil is plugged in and/or on receipt of a trigger signal.

The control device may be a central control device of the magnetic resonance device (e.g., a central computation system). In one embodiment, a lower order control device may be configured for the described measures. In another embodiment, a control device configured to generate the information may be provided. Various options may be provided.

In one embodiment of the magnetic resonance device, a patient couch (e.g., a patient bed) of the magnetic resonance device may include a number of plug-in stations for local coils, each plug-in station being connected to a plug-in station-specific bus system connected to a master. For example, the patient couch may be provided with eight plug-in stations disposed in a distributed manner over the patient couch. A specific bus system is assigned to each of the plug-in stations in order to also be able to utilize a wide range of available addresses for the disclosure of state changes to the magnetic resonance device. Each of the buses features a master on the magnetic resonance device side, the storage devices of connected local coils forming the slaves. When a trigger signal is generated, the generated trigger signal is an indication that the storage devices may be read. The master scans the available addresses on its specific bus and passes on the content requested by the storage devices (e.g., the at least one data item) and the address at which the scan was undertaken to the control device. This allows the control device to form the information easily. In one embodiment, two storage devices are present at a plug-in station (e.g., a head coil with a head coil upper part and a head coil lower part). A plurality of storage devices (e.g., a plurality of slaves) may be present on a bus of a plug-in station. The control device may be configured to identify the fixed part of the readout addresses of the storage facilities, in order to be able to assign these correctly.

The information may be formed such that the information may be processed by an electronic evaluation system or evaluation software, which may be dependent on the type of evaluation software or electronic evaluation system used.

When a number of bytes are used for the at least one data item describing a property of the local coil, the information may include the number of bytes multiplied by the number of readout addresses at bytes, the position of the coil data item in the information being a function of the readout address. This is described in more detail below based on an example. For example, the data item read out is a 2-byte coil code (i.e., information relating to the coil type), and three adjustable address bits are provided to modify the readout address, so that there are eight possible readout addresses. Information in the form of a 16-byte code may be generated. The 16-byte code may include eight permanently defined units of 2 bytes each (e.g., eight positions), at which the 2-byte data item may be disposed. The position within the 16-byte code determines the currently set readout address (e.g., the state of the local coil). The 16-byte information may be referred to, for example, as a "plug code." The place where the n-byte long read out data item appears within the n×m-byte long code representing the information may be defined by the m possible readout addresses at which the storage device is addressed. The information (e.g., the "plug code") combines the relevant content of the storage device with the readout address and generates a code that may be interpreted as a pointer by the magnetic resonance device. Information in the form of the "plug code" described above is one exemplary implementation of how stored content and address of a storage module may be mapped in software.

The information obtained may be evaluated in very widely differing ways (e.g., as a function of the states described by the information). An ongoing magnetic resonance image recording (e.g., a sequence) may not be terminated immediately on receipt of the trigger signal. Provision may be made to wait first for the result of the reading out of the storage facility or the storage facilities. Evaluation software may decide how to proceed further as a function of the result of the reading process (e.g., the one or more information items). An ongoing sequence may be terminated and/or a warning may be output to a user. Settings of the magnetic resonance device may be changed and/or adapted to the changed states (e.g., when the orientation of the coil is changed outside a magnetic resonance image recording). Other embodiments are possible, depending on which states or state changes are being considered.

In one embodiment, a method for indicating a change in the state of a local coil (e.g., a local coil of the present embodiments) for a magnetic resonance device includes establishing a connection, using a connector apparatus, to a plug-in station of a patient couch and reading out at least one storage device by way of the connection. At least one non-modifiable data item describing a property of the local coil is stored in the at least one storage device. The method includes acquiring measurement values describing the state of the local coil and in the event of measurement values indicating a state change, modifying the readout address of the storage device as a function of the measurement values.

The method of the present embodiments is also based on the concept of using a storage module, the data of which is and/or remains non-modifiable to map state changes of the local coil by way of the readout address. The readout address may be modified as a function of the measurement values of a detection device. The measurement values are evaluated by an evaluation device. Like the apparatuses of the present embodiments, the method has the advantage of simple implementation with respect to circuits using commercially available components. The embodiments relating to the apparatuses may be applied in a similar manner to the methods of the present embodiments, so reference may be made to the description above.

A trigger signal may also be sent to a control device of the magnetic resonance device when the readout address is modified. The control device may read out the storage device on receipt of the trigger signal. There may be no need for constant reading, which could interfere with image recording, for example. The evaluation device of the local coil generates a trigger signal, which prompts reading. Reading may also be prompted by other trigger signals (e.g., by the trigger signal occasioned by plugging a local coil into a plug-in station).

After the storage device has been read, the control device determines information describing the readout address of the storage device and the data item. As described in more detail above, this can be implemented in the manner of the "plug code," (e.g., when using a number of bytes for at least one data item, the information includes the number of bytes multiplied by the number of readout addresses at bytes, the position of the data item in the information be selected as a function of the readout address). The "plug code" may be used again by evaluation software, for example, as a pointer (e.g., to a file or the like).

A state-dependent action may be performed after evaluation of the information relating to the state of the local coil (e.g., termination of a magnetic resonance recording and/or the outputting of a warning to a user). For example, during temperature evaluation, three temperature ranges may be considered as states (e.g., a normal range, an increased temperature range and a critical temperature range). In the case of the increased temperature range, a warning may be output to a user, while in a critical temperature range, the sequence may be terminated immediately.

DETAILED DESCRIPTION OF THE DRAWINGS

Figure 1:
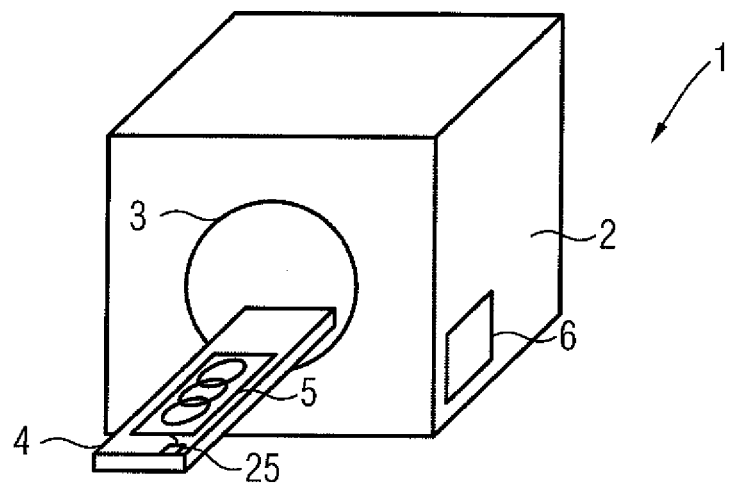
FIG. 1 shows one embodiment of a magnetic resonance device.

FIG. 1 shows one embodiment of a magnetic resonance device 1. The magnetic resonance device 1 includes a magnet arrangement 2 with a patient receiver 3, into which a patient couch 4 (e.g., a patient bed) may be moved. Disposed on the patient couch 4 is one embodiment of a local coil, 5 shown in FIG. 1 by way of example. A central control device 6 (e.g., processor or computer) controls the operation of the magnetic resonance device 1. An operating system, which may include, for example, a monitor and a corresponding input device, is also provided (not shown in detail in FIG. 1).

Figure 2:
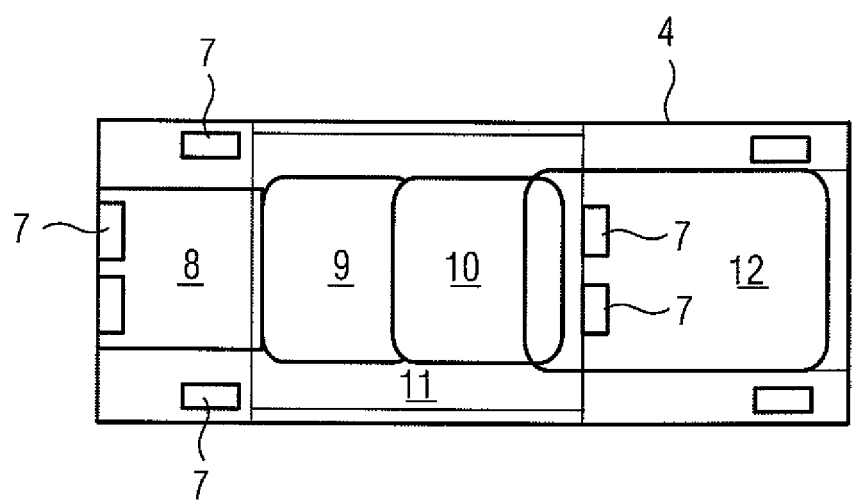
FIG. 2 shows one embodiment of a patient couch of the magnetic resonance device.

The patient couch 4 is shown in more detail in FIG. 2. In the embodiment shown in FIG. 2, eight plug-in stations 7 are disposed in a distributed manner on the patient couch 4. A local coil 5 may be connected to the plug-in stations 7 by way of a connector apparatus 25 (e.g., a plug; shown in FIG. 1).

FIG. 2 shows the positions of various local coils 5. For example, a position 8 is for head and neck coils, positions 9 and 10 are for body coils, a position 11 is for back coils and a position 12 is for local coils used on the leg for angiography. Other types of local coil may be used.

Figure 3:
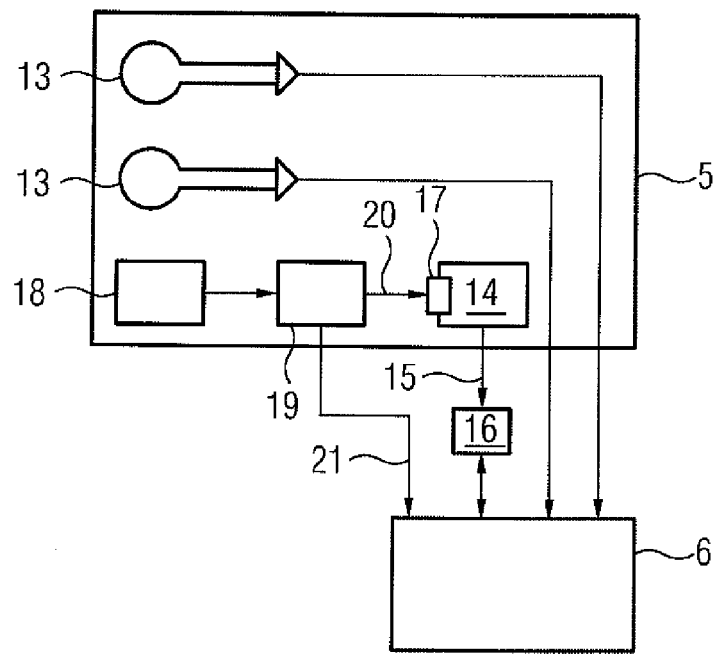
FIG. 3 illustrates the mode of operation of the present embodiments.

FIG. 3 illustrates the mode of operation of one embodiment of components of the local coil 5. The local coil 5 may not have the form shown by way of example in FIG. 1 but may be any type of local coil that may be used with the magnetic resonance device 1 (e.g., a head coil, a neck coil, a body coil, and/or a back coil). In addition to standard conductor paths 13, signals of the standard conductor paths may be transmitted by corresponding lines and connectors (e.g., pins) at the plug when the connection is established to the control device 6 of the magnetic resonance device 1. The local coil 5 also includes a storage device 14, in which various data items describing the properties of the local coil 5 are stored. For example, coil type (e.g., coil code), manufacturer, serial number and the like may be stored in the storage device 14. In one embodiment, the coil type may be transmitted to the magnetic resonance device 1 when the local coil 5 is connected and during subsequent scans of the storage device. In one embodiment, the coil type has a size of 2 bytes.

The storage device 14 may be read by way of a bus 15. The bus 15 may represent a slave (e.g., a slave bus) of a master 16. The slave bus may address the storage device 14 by way of an address defined by address bits that may be modified.

In one embodiment, a bus 15 with a master 16 is assigned to each plug-in station 7. The bus 15 may be an I2C bus, and the storage device 14 may be an electrically erasable programmable read-only memory (EEPROM) (e.g., a commercially available module such as an ATMEL AT24C04BU3-UU-T).

The capacity for modification of the readout address of the storage device 14 may result from a plurality of storage devices 14 being read out by way of the bus 15, so a unique address may be used. Address bits may be modified by way of connectors 17 assigned respectively to one address bit.

The readout address of the storage device 14 may not be used (e.g., not solely) to operate a plurality of storage devices 14 on the bus 15, but the capacity for modification of the readout address may be utilized in order to be able to disclose state changes of the local coil 5 connected to the control device 6 of the magnetic resonance device 1.

The local coil 5 includes a detection device 18, which records measurement values that describe the state of the local coil 5. The measurement values are evaluated by an evaluation device 19 (e.g., an evaluation circuit). If the measurement values indicate a state change, the evaluation device 19 may perform two actions. The address bits of the storage device 14 are controlled by way of corresponding lines (e.g., arrow 20) and the connectors 17 so that the readout address of the storage device 14 changes. The state change is reflected in a modification of the readout address, which may describe the state of the local coil 5. Also, the evaluation device 19 sends a trigger signal to the control device 6 (e.g., arrow 21) by way of a specific line (and a specific pin).

In response to the trigger signal, the control device 6 activates the master 16 to read out the storage device 14 again, the master 16 attempting this at a number of possible readout addresses. Both the read out data (e.g., coil type) and the address, at which the data item may be read out, are transmitted to the control device 6, which forms information that may be further processed therefrom. The state change of the local coil 5 may be disclosed to the magnetic resonance device 1 (e.g., the control device 6). The trigger signal is used so that the storage device 14 may not be read continuously or intermittently, since such digital traffic may interfere with image recording during a sequence.

The storage device 14 is also read out by the control device 6 when the local coil 5 is connected to a plug-in station 7 on the patient couch 4. A trigger signal may also be generated when the local coil 5 is connected to the plug-in station 7 on the patient couch 4. This may be done, for example, by reserving two pins of the plug-in station 7 for this purpose. The two pins of the plug-in station 7 may be connected when a plug is plugged into the plug-in station 7, so that the trigger signal results. The control device 6 knows that something has been plugged in at the plug-in station 7, and the corresponding master 16 may be activated to read out storage devices 14 connected thereto by way of the bus 15.

In one embodiment, not all the address bits of the storage device 14 may be modified by the evaluation device 19; one address bit remains fixed. This is because the local coil 5 may also be a head coil. In the case of a head coil, the head coil may include a head coil upper part and a head coil lower part. The head coil lower part is plugged into the plug-in station 7 on the patient couch 4 and includes a storage device 14 that may be read out during plugging in. The head coil upper part is not connected directly to the plug-in station but plugged into the head coil lower part. The head coil upper part also has a storage device 14, which may be read out when the head coil upper part, is plugged in. The storage device 14 of the head coil upper part may be at a different address from the head coil lower part. Once the head coil upper part has been plugged in, when a trigger signal is sent to the control device 6 again, the storage devices 14 of the head coil upper part and the head coil lower part may be identified at different addresses and read out at the plug-in station 7. One address bit may be fixed, for example, and may be used to designate the head coil upper part or the head coil lower part. If a total of three address bits are provided, for example, two address bits still remain in order to be able to map different states of the local coil 5.

Two more examples of possible states of local coils 5 are explained in more detail below. All types of detection devices 18 that are able to supply useful state information may be used (e.g., detection facilities 18 that detect switch positions at the local coil 5 or the like).

In one embodiment, the detection device 18 is a temperature detector. The temperature detector may monitor, for example, the temperature of a module of the local coil 5. If the temperature rises above a predefined temperature or enters a new predefined temperature interval, a state change is present, which is identified by the evaluation device 19. The address bits of the storage device 14 and the readout address are thus modified correspondingly by way of the connectors 17, and a trigger signal indicating the state change is sent to the control device 6. Such an embodiment may be used with a local coil 5 configured to transmit, since high temperatures may easily result in the local coil 5.

Another application is the orientation of the local coil 5 relative to the basic magnetic field of the magnetic resonance device 1, which may be relevant, for example, with anterior abdomen coils and with coils that may be oriented at the foot or head end of the patient couch 4 (e.g., peripheral angiography arrays). The detection device 18 may include one or more Hall sensors, which may be used to ascertain orientation. Four intervals may be defined, for example, which define certain orientations (e.g., orientations of 0°, 90°, 180° and 270°) of the local coil 5 in relation to the basic magnetic field. If the orientation changes, the state changes, and the control device 6 may be informed as described above.

Figure 4:
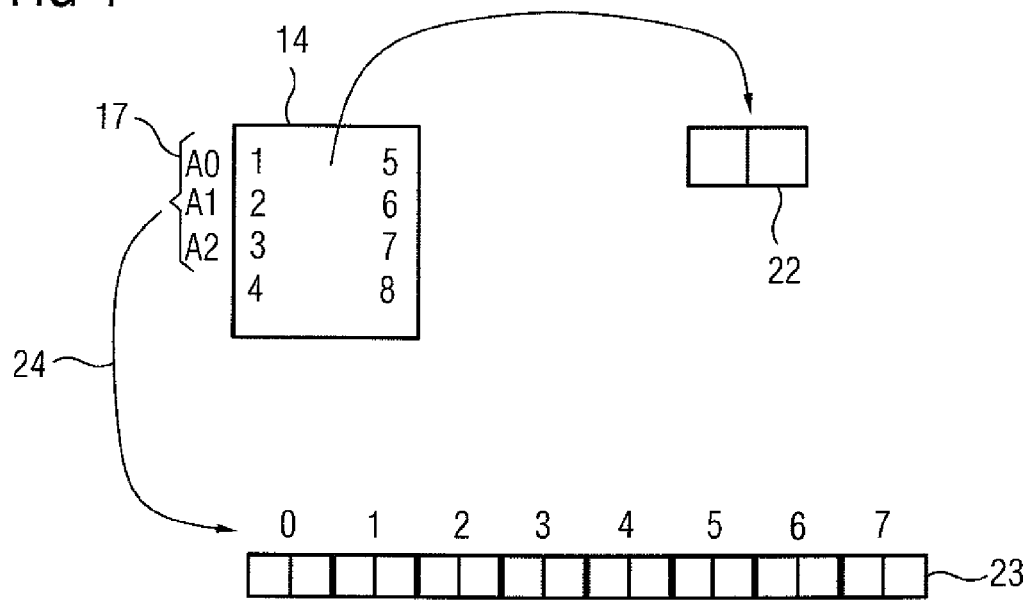
FIG. 4 illustrates the derivation of information from a data item and a readout address.

The data read out from the storage device 14 and the readout addresses are converted by the control device 6 to information suitable for evaluation software (e.g., see FIG. 4). FIG. 4 shows an example of the determination of information that may be designated as a "plug code." It may be assumed that a data item 22 read out of the storage device 14 (e.g., the coil type) is 2 bytes in size. In the embodiment shown in FIG. 4, there are also three address bits A0, A1 and A2 that may be modified by the evaluation device 19. The number of address bits may be reduced, if a number of storage devices 14 are to be operated on one bus 15.

As shown in FIG. 4, there may be eight possible readout addresses. In one embodiment, the information 23 contains 16 bytes, 2 bytes of which are assigned to a possible readout address. In other words, the readout address defines the position within the information 23 where the data item 22 is located (e.g., see also arrow 24). This is explained further with reference to an example.

Let it be assumed that the 2-byte coil type is 101B. The current address is "001" (e.g., "1" in a decimal notation). The following information results "0000|101B|0000|0000|0000|0000|0000|0000".

A type of pointer may be implemented, for example. The pointer may be used by the evaluation software, and may also be provided on the control device 6. The information 23 may be utilized to locate a specific file, for example, which contains information about the coil type and the state. Other types of evaluation are also possible.

The control device 6 may implement different measures as a function of the state described by the readout addresses. The lowest address may be selected for the normal state (e.g., "000" or "00") if one of the address bits is to be fixed, to allow a number of storage devices 14 on one bus 15.

One response of the control device 6 to a state change disclosed to the control device may be, for example, the termination of an ongoing sequence, the outputting of a warning to a user, or a simple reconfiguration. This is a function of the type of states being considered and the current overall situation (e.g., whether a measurement is present).

When selecting the storage device 14, magnetic resonance compatibility may also be taken into account (e.g., in respect of residual magnetization or the like).

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A local coil for a magnetic resonance device, the local coil comprising:
    a connector apparatus for establishing a connection to a plug-in station on a patient couch; and
    a storage device that is operable to be read out by way of the connection, the storage device storing a non-modifiable data item describing a property of the local coil,
    wherein the local coil comprises a detection device for acquiring measurement values describing the state of the local coil, and an evaluation device configured to modify a readout address of the storage device as a function of the measurement values.

2. The local coil as claimed in claim 1, wherein the evaluation device is further configured to transmit a trigger signal to a control device of the magnetic resonance device when the readout address of the storage device is modified.

3. The local coil as claimed in claim 1, wherein the storage device comprises an EEPROM or a flash memory, the storage device is operable to be read out by a bus system or combinations thereof.

4. The local coil as claimed in claim 1, wherein the readout address is set by a plurality of address bits that are modified by corresponding connectors of the storage device.

5. The local coil as claimed in claim 4, wherein only some of the address bits of the plurality are modified by the evaluation device.

6. The local coil as claimed in claim 1, wherein the detection device comprises a temperature detector, an orientation detector, or the temperature detector and the orientation detector.

7. A magnetic resonance device comprising:
    a patient couch;
    a control device configured to read out a storage device of a local coil by way of a data connection established by a connector apparatus of the local coil plugged into a plug-in station on the patient couch, the control device being configured to determine information describing a readout address of the storage device and a data item stored in the storage device, the data item describing a property of the local coil;
    a detection device for acquiring measurement values describing the state of the local coil; and
    an evaluation device configured to modify the readout address of the storage device as a function of the measurement values.

8. The magnetic resonance device as claimed in claim 7, wherein the patient couch comprises a plurality of plug-in stations for local coils, each plug-in station of the plurality being connected to a plug-in station-specific bus system connected to a master.

9. The magnetic resonance system as claimed in claim 7, wherein when using a plurality of bytes for the data item, the information comprises the number of bytes multiplied by the number of readout addresses at bytes, the position of the data item in the information being a function of the readout address.

10. A method for indicating a change in the state of a local coil for a magnetic resonance system, the method comprising:
    establishing a connection, with a connector apparatus, to a plug-in station on a patient couch; and
    reading out from a storage system by way of the connection, a non-modifiable data item describing a property of the local coil,
    wherein reading out the storage system comprises:
        acquiring measurement values describing the state of the local coil; and
        modifying a readout address of the storage system as a function of the measurement values when the measurement values indicate a state change.

11. The method as claimed in claim 10, wherein when the readout address is modified, a trigger signal is sent to a control system of the magnetic resonance system, the control system reading out the storage system on receipt of the trigger signal.

12. The method as claimed in claim 10, further comprising determining, by the control system, information describing the readout address of the storage system and the non-modifiable data item after the storage device is read out.

13. The method as claimed in claim 12, wherein when a number of bytes are used for the non-configurable data item, the information comprises the number of bytes multiplied by a number of readout addresses, the position of the non-configurable data item in the information being selected as a function of the readout address.

14. The method as claimed in claim 12, further comprising performing a state-dependent action after the information is evaluated in relation to the state of the local coil.

15. The local coil as claimed in claim 3, wherein the bus system is an I2C bus.

16. The local coil as claimed in claim 4, wherein the readout address is set by two or three address bits.

17. The local coil as claimed in claim 6, wherein the detection system comprises a Hall sensor.

18. The magnetic resonance system as claimed in claim 8, wherein when using a plurality of bytes for the data item, the information comprises a number of bytes multiplied by the number of readout addresses at the bytes, the position of the data item in the information being a function of the readout address.

19. The method as claimed in claim 11, further comprising determining, by the control system, information describing the readout address of the storage system and the non-modifiable data item after the storage device is read out.

20. The method of claim 14, wherein performing the state-dependent action comprises terminating a magnetic resonance recording or outputting a warning to a user.

* * * * *